United States Patent
Kuhara et al.

(10) Patent No.: US 7,189,012 B2
(45) Date of Patent: Mar. 13, 2007

(54) SEMICONDUCTOR LASER MODULE HAVING A CO-AXIAL PACKAGE AND TRANSMISSION LINES FOR COMPLEMENTARY DRIVING SIGNAL

(75) Inventors: Yoshiki Kuhara, Osaka (JP); Tomoyuki Funada, Osaka (JP); Masaki Furumai, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 199 days.

(21) Appl. No.: 10/854,857

(22) Filed: May 26, 2004

(65) Prior Publication Data

US 2005/0013561 A1 Jan. 20, 2005

(30) Foreign Application Priority Data

May 27, 2003 (JP) ............................. 2003-149833

(51) Int. Cl.
*G02B 6/36* (2006.01)
*H01S 3/04* (2006.01)

(52) U.S. Cl. ........................ 385/92; 385/88; 385/52; 385/14; 372/43.01; 372/50.1

(58) Field of Classification Search ................. 385/52, 385/88, 89, 92, 93, 94, 14; 372/43.01, 46.01, 372/50.1, 50.124
See application file for complete search history.

(56) References Cited

U.S. PATENT DOCUMENTS

| | | | | |
|---|---|---|---|---|
| 6,932,518 B2* | 8/2005 | Greenlaw | ..................... | 385/88 |
| 2002/0168153 A1* | 11/2002 | Yamabayashi et al. | ........ | 385/88 |
| 2003/0214860 A1* | 11/2003 | Greenlaw | .................... | 365/200 |
| 2004/0037334 A1* | 2/2004 | Funada et al. | ................ | 372/43 |
| 2004/0090620 A1* | 5/2004 | Farr | ........................... | 356/222 |
| 2006/0083517 A1* | 4/2006 | Saito et al. | ................. | 398/140 |

FOREIGN PATENT DOCUMENTS

JP 11-233876 8/1999 ............... 388/92 X

* cited by examiner

*Primary Examiner*—Brian M. Healy
(74) *Attorney, Agent, or Firm*—Fish & Richardson P.C.

(57) ABSTRACT

The present invention provides a semiconductor laser module in which parasitic inductance due to the bonding wire is removed, accordingly, the high frequency performance thereof can be enhanced. The laser module of the present invention has a sub-mount, on which the semiconductor laser diode is installed and transmission lines for supplying the signal to the laser diode is formed. The transmission lines on the sub-mount are directly connected to corresponding lead pins provided in the base of the package without any bonding wires. Between the lead pins and under the sub-mount is provided a photo diode for monitoring light emitted from the laser diode.

13 Claims, 12 Drawing Sheets

US 7,189,012 B2

SEMICONDUCTOR LASER MODULE HAVING A CO-AXIAL PACKAGE AND TRANSMISSION LINES FOR COMPLEMENTARY DRIVING SIGNAL

BACKGROUND OF THE INVENTION

1. Field of the Invention

The present invention relates to a semiconductor laser module that provides a co-axial TO-CAN type package and transmission lines therein for complementary driving signal.

2. Related Prior Art

A conventional laser module having a co-axial shape is shown in FIG. 12. The laser module 60 includes a base 61, a block 62 on the base 61. A sub-mount 63 on which the laser diode 64 is mounted is disposed on the block 62. The base 61 further includes lead pins 65 and 66 electrically isolated from the base 61. One of lead pins 65 is connected to the anode electrode, which is formed on the top surface, of the laser diode 64 via the bonding wire 67. Another lead pin 66 is also connected to the anode electrode of the laser diode and grounded in the outside of the laser module 60. The base further includes the third lead pin 69 connected to the cathode electrode, which is formed on the bottom surface, of the laser diode 64 via the bonding wire 70 and the surface of the sub-mount 63.

Moreover, a signal for driving the laser diode 64 having a complementary mode is provided thereto just before the laser module 60 to balance the load characteristic for the complementary signal.

However, the conventional laser module shown in FIG. 12 has a significant gap between the tip of the lead pin and the electrode of the laser diode, which causes to increase the parasitic inductance when connecting therebetween by a bonding wire and degrades the high frequency performance of the laser module. Accordingly, one object of the present invention is to provide a laser module having a superior high frequency performance even in a co-axial type package.

SUMMARY OF THE INVENTION

According to one aspect of the present invention, a semiconductor laser module includes a semiconductor laser diode, a sub-mount, a stem, and a first and second lead pins. The semiconductor laser diode emits light by supplying a driving signal between these two electrodes. The sub-mount mounts the laser diode and provides a first and second transmission lines. The first transmission line is connected to one electrode of the laser diode, while the second transmission line is connected to the other electrode thereof. The stem includes a disk-shaped base and a block disposed on the base. The block mounts the sub-mount. The first and second lead pins are disposed in the base for inputting a first signal and a second signal, respectively. Preferably, these two signals are complementary to each other. The driving signal supplied to the laser diode is one of the first signal and the second signal. In the optical module of the present invention, the first and second lead pins are directly connected to the first and second transmission lines formed on the sub-mount, respectively.

Since lead pins, through which a signal for driving the semiconductor laser diode is provided, are directly connected to transmission lines matched their impedance to a predetermined value and the laser diode is also connected to the transmission lines without the bonding wire, the parasitic inductance attributed to the bonding wire can be removed and the high frequency performance of the laser module can be enhanced.

The semiconductor laser module of the present invention may include a photo diode for monitoring the light emitted from the semiconductor laser. The photo diode may have a surface-receiving configuration mounted on the base under the sub-mount, or an edge-receiving configuration mounted on the sub-mount and beneath the semiconductor laser diode. The present laser module has a space under the sub-mount and between first and second lead pins on the base. Accordingly, by mounting the photo diode in the space, the module can realize a compact package including the stem and the cap.

The first and second transmission lines may be a microstrip line having predetermined transmission impedance, and may include a resistor, the shape of which may be a thin film resistor or a chip resistor, on a way to the semiconductor laser diode. By equalizing resistance of the resistor to the transmission impedance or approximately to the transmission impedance, the quality of the output optical signal can be enhanced because of reducing the impedance mismatching.

Further, one of the transmission line may have a via hole immediately beside the semiconductor laser for electrically connecting the transmission line to the block. Grounding the stem and connecting the one electrode of the semiconductor laser diode to the transmission line having the via hole, the ground potential for the semiconductor laser diode can be stabilized, accordingly, the quality of the output optical signal can be enhanced.

Another aspect of the present invention relates to a semiconductor laser apparatus that includes the previously described semiconductor laser module and an optical receptacle. The optical receptacle, attached to the front side of the semiconductor laser module, has a function to align the semiconductor laser module with an optical fiber to be coupled thereto. The optical receptacle includes an alignment member, a sleeve, a stub, and a sleeve cover. The alignment member is disposed to cover the package of the semiconductor laser module, and by sliding the alignment member on the outer surface of the package thereof, the optical alignment along the optical axis, which connects the optical fiber and the semiconductor laser diode, can be performed. For the optical alignment in directions across the optical axis can be preformed by sliding an assembly of the sleeve, the stub, and the sleeve cover on the end face of the alignment member. Thus, the optical alignment in all directions can be realized.

DETAILED DESCRIPTION OF PREFERRED EMBODIMENTS

Figure 1:
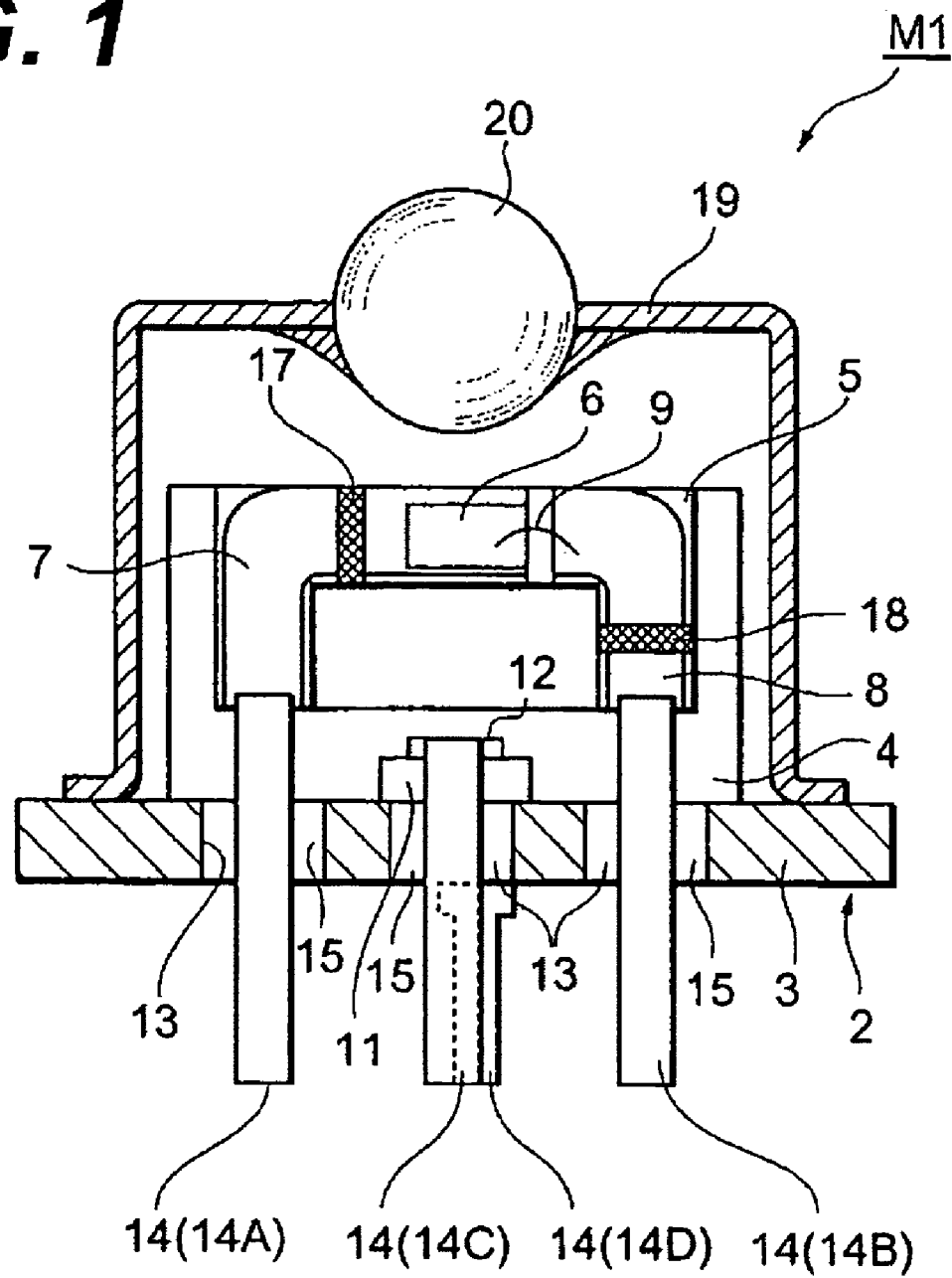
FIG. 1 is a cross section of the semiconductor laser module of the first embodiment viewed from the side.

Next, preferred embodiments of the present invention will be described as referring to accompanying drawings. In the drawings and the specification, same elements will be referred by the same symbols and numerals without overlapping explanations.

(First Embodiment)

Figure 2:
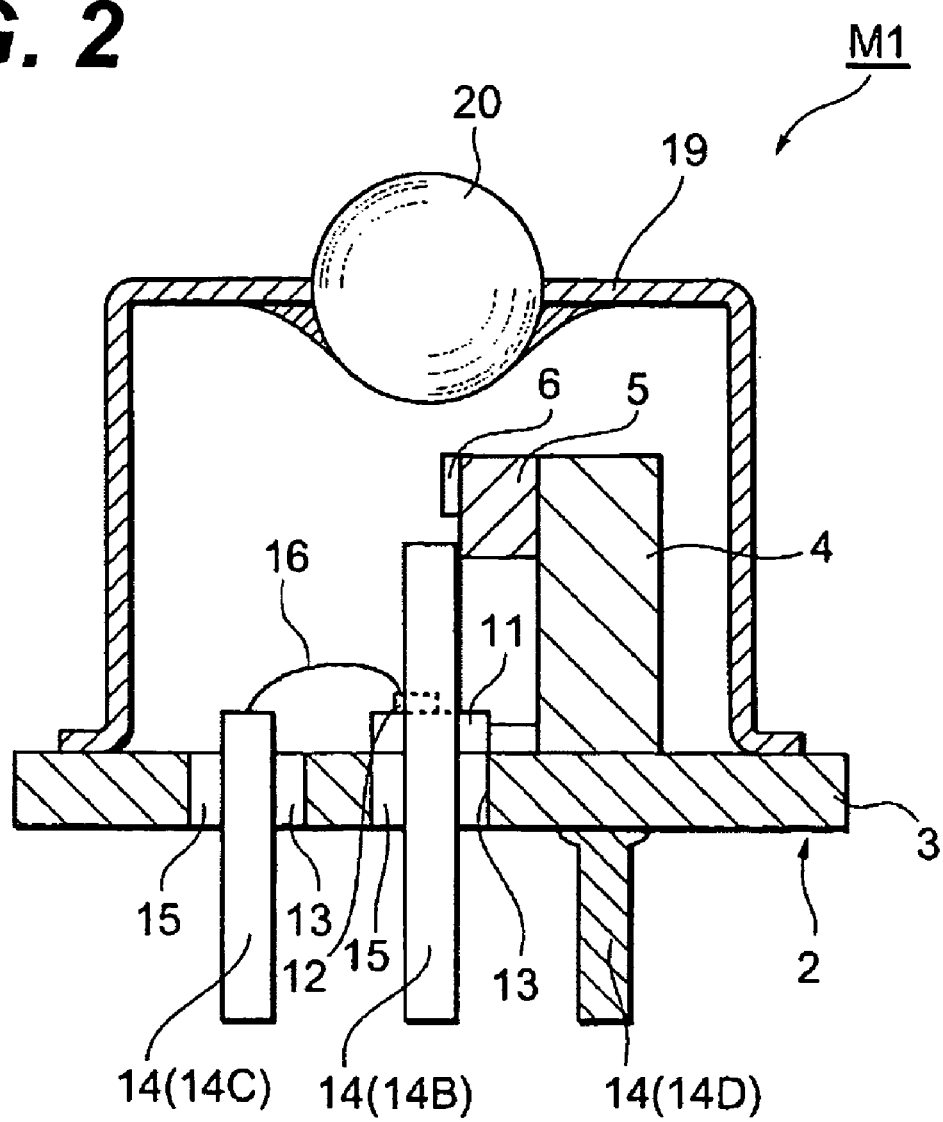
FIG. 2 is a cross section of the semiconductor laser module of the first embodiment viewed from the front.
Figure 3:
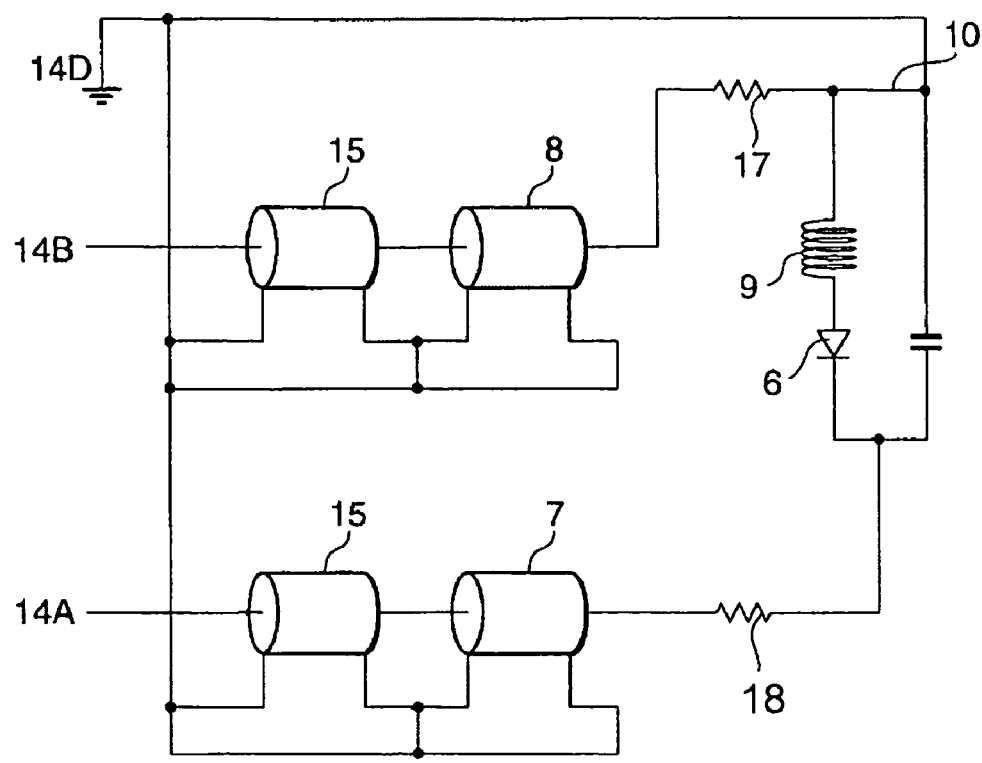
FIG. 3 is an equivalent circuit diagram of the semiconductor laser module according to the first embodiment.

FIG. 1 is a side cross sectional view, FIG. 2 is a perspective view, and FIG. 3 is a plan cross sectional view of a semiconductor laser module of the first embodiment according to the present invention. As shown in FIGS. 1 to 3, the semiconductor laser module 1 has a stem comprising a disk-shaped base 3 and a block 4 both made of metal, preferably made of copper. The block 4 is placed and fixed on the base 3. In the embodiment shown in FIG. 1, although the block 4 is individually formed from the base 4, it may be integrally formed.

On the block 4 is provided by a sub-mount 5, for example made of aluminum nitride (AlN), and a semiconductor laser 6 is mounted on the sub-mount 5. The sub-mount 5 shapes a rectangle smaller than the block 4 and mounted on the upper portion of the side surface of the block 4, accordingly, a space is formed beneath the sub-mount 5. Other materials, such as silicon carbide (SiC), boron nitride (BN), diamond, or some ceramics having good thermal conductivity, may be used for the sub-mount 5. Nitriding steel (SPC steel) in addition to copper may be used for the block 4. Table 1 below shows thermal conductivity of various materials for the sub-mount 5 and the block 4.

TABLE

Thermal conductivity of materials for the sub-mount and the block

| for sub-mount | thermal conductivity (W/m/K) | for block | thermal conductivity (W/m/K) |
|---|---|---|---|
| AlN | 170–230 | SPC steel | 26 |
| SiC | 420 | Cu | 398 |

By applying materials above listed for the block 4 and the sub-mount 5, a temperature of the laser diode 6 may be suppressed in elevating, whereby the operation of the laser diode 6 can be stabilized. Further, the bias current supplied to the laser diode 6 can be also suppressed, which results on the compactness of the driver circuit for the laser diode 6.

On the surface of the sub-mount 5 is formed a first transmission line 7 and a second transmission line 8, which may be a micro-strip line. The first transmission line 7, made of gold (Au), extends from the lower left of the sub-mount 5 to a center portion thereof, where the laser diode 6 is mounted, and the end of the first transmission line 7 is connected to the cathode of the laser diode 6. While, the second transmission line 8, which is also made of gold, extends from the lower right of the sub-mount 5 to the center portion, and the end thereof is terminated to the block 4. The anode of the laser diode 6 is also terminated to the block 5 via the bonding-wire 9. The laser diode 6 preferably has a multiple quantum well (MQW) laser made of InGaAsP and InP having a Fabry-Perot configuration, or a MQW laser having a distributed feed-back (DFB) configuration.

On the surface of the base under the sub-mount 5 is provided a sub-mount 11 on which the photo diode having a surface-receiving configuration is mounted for a monitoring device. Thus, the sub-mount 11 is positioned in a space formed under the laser diode 6 and the sub-mount 5. The photo diode is mounted on the sub-mount 11 such that the light-receiving surface thereof faces to the laser diode 6 to receive light emitted from the laser diode 6.

The base 3 provides a plurality of via holes 13, four holes in the present embodiment. A lead pin 14 is inserted into the corresponding via hole 13 with seal glass in a gap between the lead pin 14 and the inner face of the via hole 13. The first lead pin 14A for an opposite phase input and the second lead pin 14B for a normal phase input pass respective sides of the sub-mount 11 for the photo diode and extend to the lower edge of the sub-mount 5 for the laser diode. The first lead pin 14A in its tip portion is connected to the first transmission line 7 formed in lower left portion of the sub-mount 5, while the second lead pin 14B in its top portion is connected to the second transmission line 8 formed in the lower right portion of the sub-mount 5. These first and second lead pins are connected to a driving circuit having a differential output disposed in the outside of the module. The driving circuit is not shown in FIGS. 1 to 3.

The third lead pin 14C is coupled to the photo diode 12 with a bonding wire 16, and another lead pin 14D is disposed in the back surface of the base 3, which is opposite to the surface the sub-mount 11 for the photo diode 12 is mounted. The lead pin 14D is short-circuited to the base; therefore the stem 2 is grounded when the lead pin 14D is grounded. Accordingly, the anode 6 of the laser diode 6, which is connected to the block with a bonding wire 9, is grounded.

The laser diode 6 is directly mounted in the end portion of the first transmission line 6. A first thin film resistor 17 made of, for example tantalum nitride (TaN) is formed between the laser diode and the first lead pin 14A of the first transmission line 7. A second thin film resistor 18, which is also made of tantalum nitride, is formed between the laser diode 6 and the second lead pin 14B of the second transmission line such that one electrode thereof is grounded and the other electrode is connected to the second lead pin 14B. Another form of resistor, such as chip resistor, may be replaced for the thin film resistor.

A cap 19 having a tubular shape is disposed on the base 3 to cover and enclosed the laser diode 6, the photo diode 12, the sub-mount 5 and another sub-mount 11 therein. A center of the cap 19 is disposed a lens 20 for concentrating light emitted from the laser diode 6. Thus, the base 3 and the cap, which constitute a semiconductor laser module M1, forms a package with the TO-CAN standard.

In the laser module M1 of the present invention, the transmission lines 7 and 8 are formed on the sub-mount 5, one electrode of the laser diode 6 is directly connected thereto, and the first and second lead pins are directly connected to the first and second transmission lines, respectively. Therefore, a signal for driving the laser diode 6 is transmitted in the transmission line; thus remarkably reducing parasitic inductance attributed to the bonding-wire.

Further, the transmission lines 7 and 8 each provide resistors 17 and 18 therein. These resistors 7 and 8 may operate as a dumping resistor that reduces an impedance miss-matching effect. Therefore, a high frequency performance of the laser module M1 can be improved as compared that the resistor for impedance matching is disposed outside of the module.

FIG. 3 is an equivalent circuit diagram of the laser module M1. The first lead pin 14A, which receives the normal phase signal, is connected to the cathode of the laser diode 6. While the second lead pin 14B for receiving the opposite phase input is grounded via the resistor 18. The normal phase signal and the opposite phase signal may be cancelled in the ground where the anode of the laser diode 6 is connected, which stabilizes the ground potential, reduces the electromagnetic induced (EMI) noise, and enhances the high frequency performance.

In the embodiment thus described, the block and the base are individually provided and assembled together. However, another configuration may be applicable that a portion of the base is formed thick and the sub-mount 5 for the laser diode is mounted on the portion. Further, a configuration that the anode of the laser diode is connected to the first transmission line 7 and the cathode thereof is connected to the block 4 may be also applicable.

(Second Embodiment)

Next, the second embodiment of the present invention will be described.

Figure 4:
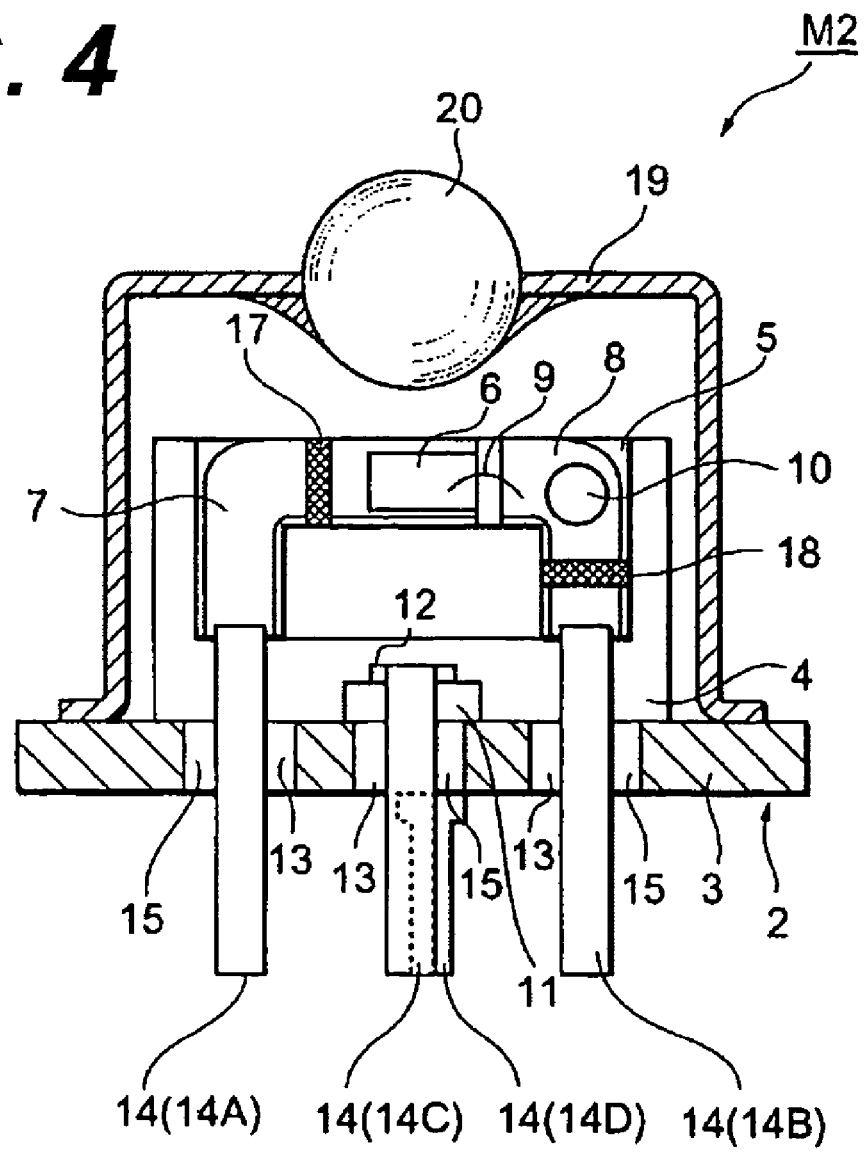
FIG. 4 is a cross section of the semiconductor laser module according to the second embodiment viewed from the side.

FIG. 4 is a side cross section view showing the semiconductor laser module M2 according to the second embodiment. The laser module M2 provides, in addition to the laser module M1 of the first embodiment, a via hole 10 in the second transmission line 8 to electrically connect the transmission line 8 to the block 4. The via hole 10 grounds the second transmission line 8 to the block 4. Thus, the anode electrode of the laser diode 6, which is formed on the upper surface thereof, is grounded through the second transmission line 8 and the via hole 10 to the block 4.

In the laser module M1 of the first embodiment, the normal phase signal and the opposite phase signal can be cancelled at the second transmission line. While in the present laser module M2, both signals can be canceled and grounded at the second transmission line 8. Thus, the EMI noise can be further reduced and the high (Third Embodiment)

Figure 5:
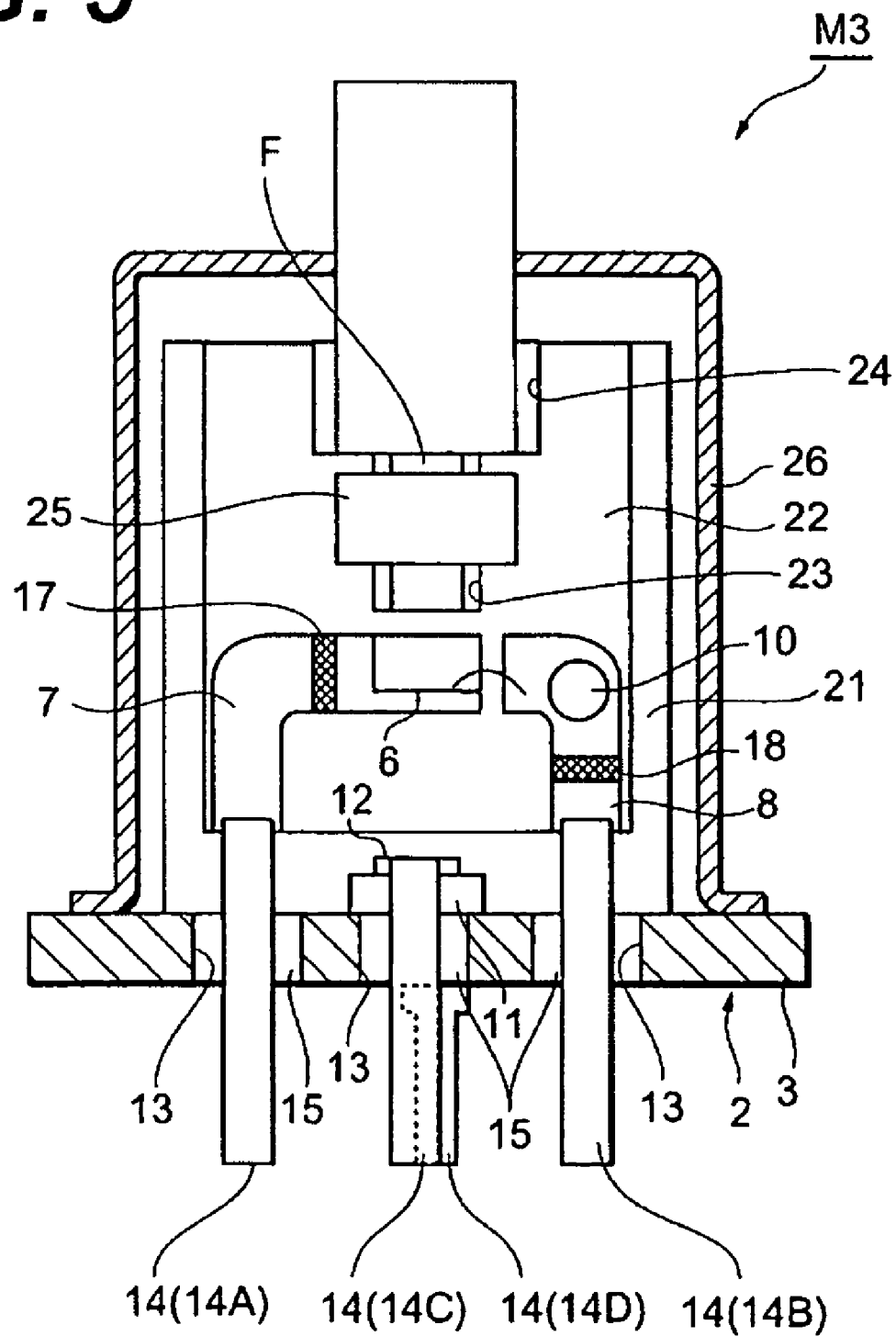
FIG. 5 is a cross section of the semiconductor laser module according to the third embodiment viewed from the side.

FIG. 5 is a side cross sectional view of the laser module M3 according to the third embodiment. The laser module M3 provides a block 21 having a greater height compared to the block 4 in laser modules previously described.

The sub-mount 22 for the laser diode in this embodiment provides a first groove 23, a cross section of which has a V-shape, on the upper portion of the side surface thereof. Within in the first groove 23 is disposed by an optical fiber F Another groove 24 with a V-shape relatively larger than the first groove 23, is formed at the region extended from the first groove 23. The latter V-groove 24 is formed deeper than the former V-groove 23, and is disposed a tube therein for protecting the optical fiber F. Further, on the first V-groove 23 is disposed by a cramp 25. Other configurations except for thus described are same as those in the first and second embodiments.

In the laser module M3, because of the V-groove 23 for disposing the optical fiber F, the optical coupling between the optical fiber F and the laser module can be facilitated. Moreover, only disposing the optical fiber F into the first V-groove 23 can align the fiber F with the laser diode 6, which can save the optical alignment with the lens.

(Fourth Embodiment)

Figure 6:
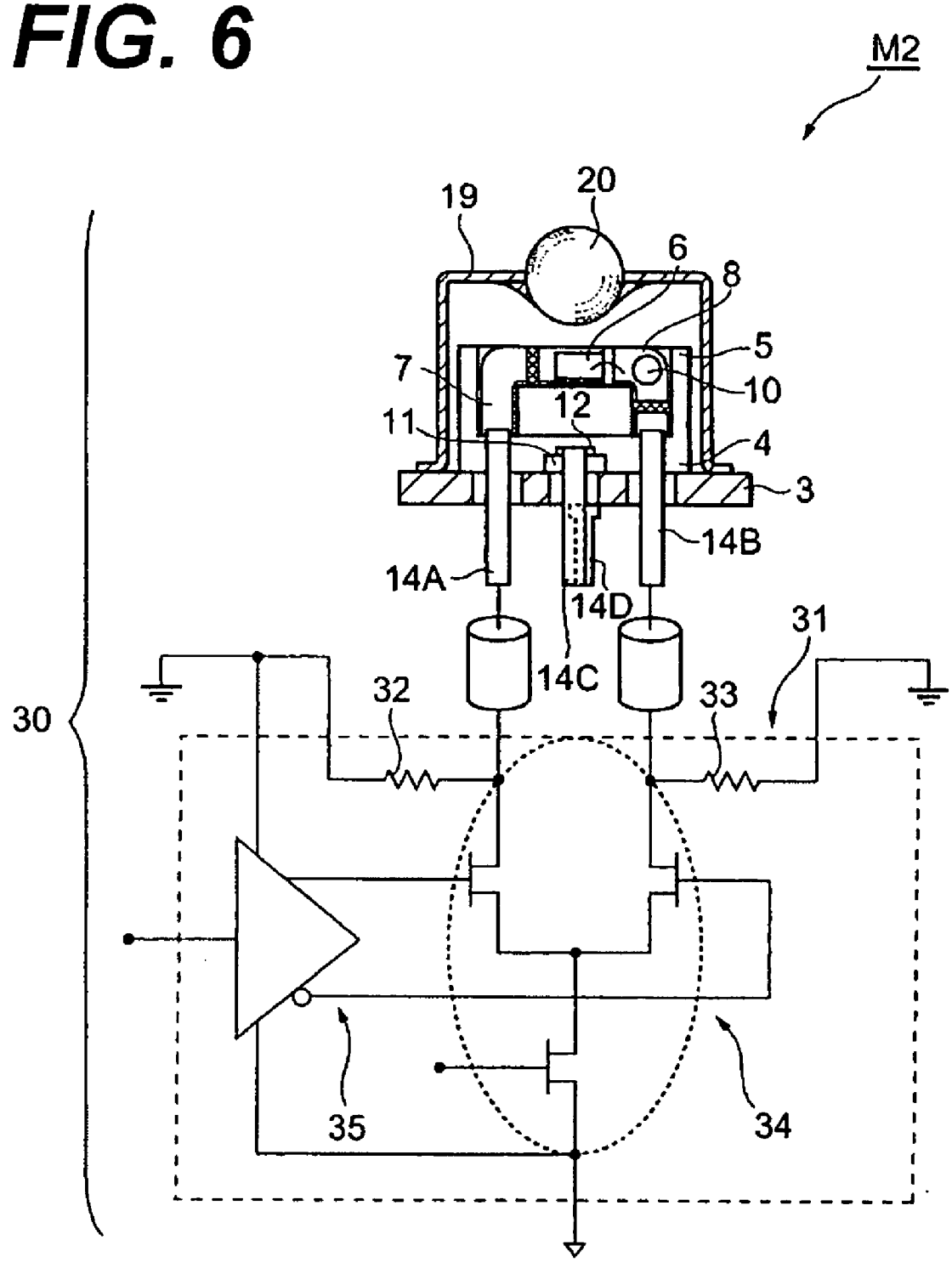
FIG. 6 is a circuit diagram of the semiconductor laser apparatus according to the fourth embodiment.

FIG. 6 shows a circuit diagram for driving the laser module. The semiconductor laser apparatus 30 includes a driver 31 for driving the laser diode 6 and connected to the lead pins 14A and 14B as shown in FIG. 2. The driver 31 has a pair of termination resistors 34 and 35, which lower the multiple reflection due to the impedance mismatching between the transmission line and the output impedance of the driver 31, thereby generating an optical signal with high quality.

Figure 7:
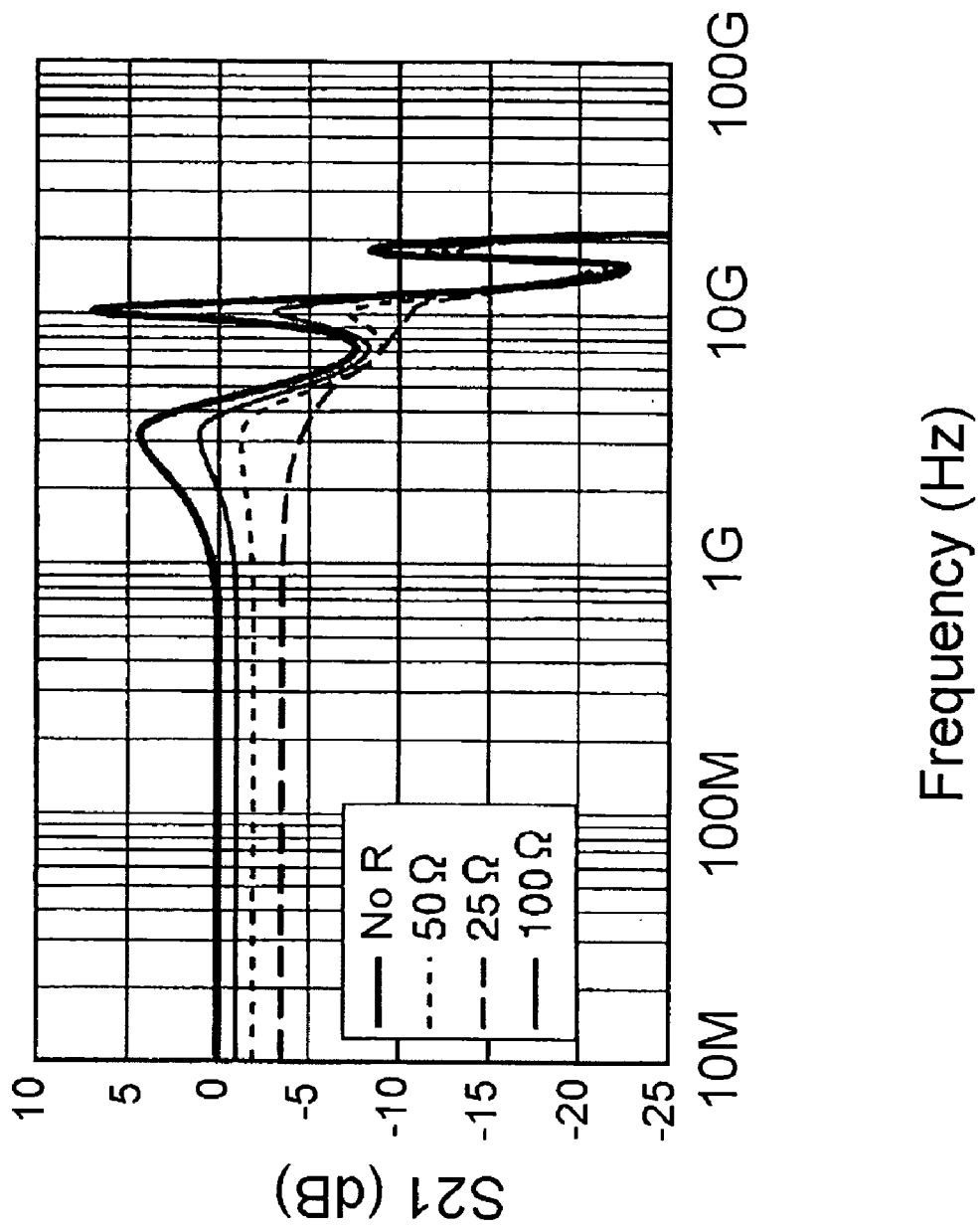
FIG. 7 shows high frequency performances of the semiconductor laser module when the termination resistor is provided in the driver circuit.

The resistance of the termination resistor may be matched or nearly equivalent to that of the transmission line. For example, high frequency characteristics of various cases for the termination resistor are shown in FIG. 7. In FIG. 7, the impedance of the transmission line is assumed to be 20Ω, and the cases of the termination resistor not only from 25Ω to 100Ω but also no resistor are shown.

As shown in FIG. 7, by providing the termination resistor in the driver, the fluctuation in the frequency response can be reduced. The resistance of the termination resistor is 20 Ω, which fully matches to that of the transmission line. However, the lower the resistance thereof, the larger the loss of the driving current. Therefore, the resistance may be decided as taking the increase of the loss of the driving current into account.

Figure 8A:
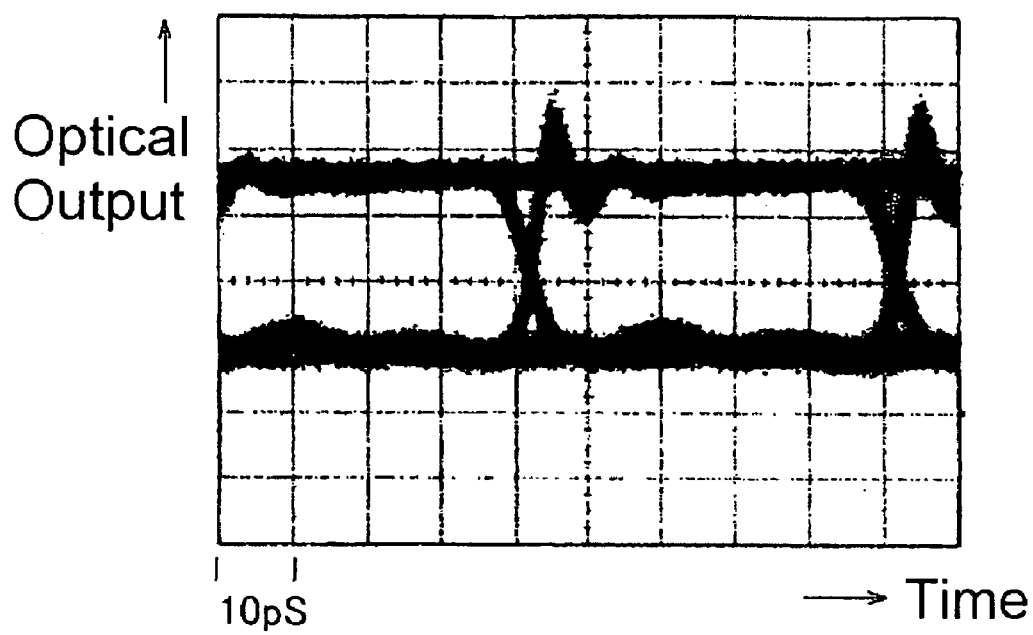
FIG. 8A shows an optical output when the termination resistor is provided in the driver circuit.
Figure 8B:
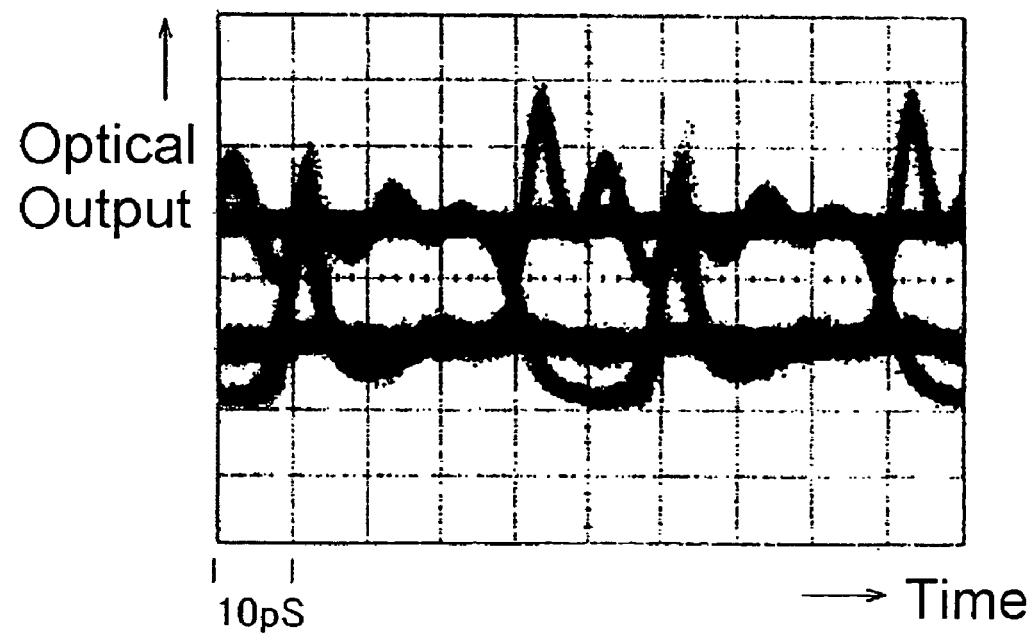
FIG. 8B shows an optical output when no resistor is provided in the driver circuit.

FIG. 8A and FIG. 8B are the comparison in the eye diagram of the optical output of the laser module whether the termination resistance presents in the driver or not. FIG. 8A corresponds to the result when the termination resistor exists, while FIG. 8B shows the results of no termination resistor. As clearly shown in FIG. 8A and FIG. 8B, the existence of the termination resistor stabilizes the optical output of the laser module.

(Fifth Embodiment)

Figure 9:
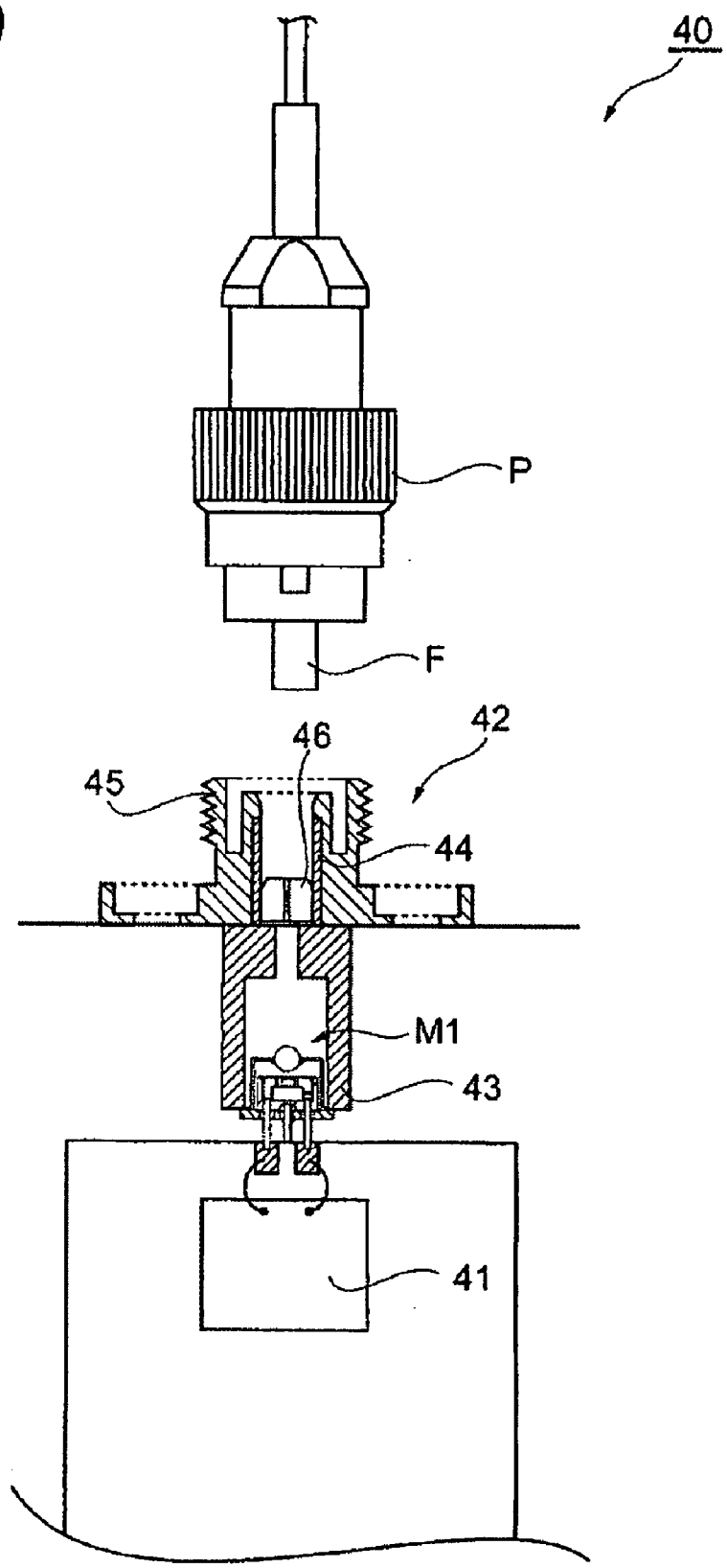
FIG. 9 is a cross section of the semiconductor laser module according to the sixth embodiment viewed from the side.

FIG. 9 is a side cross sectional view showing a semiconductor laser apparatus 40 according to the fifth embodiment of the present invention. The laser apparatus 40 includes the laser module M1 of the first embodiment, and an optical receptacle 42 for optically coupling to the optical fiber. The optical receptacle 42 provides an alignment member 43, a sleeve 44 disposed adjacent to the alignment member 43, and the sleeve cover 44 outside of the sleeve 44. The sleeve cover 45 has a screw 45A in the outside thereof to mate with the optical plug P. Within the sleeve 44 is disposed by the stub 46, a coupling fiber is provided in the center of the stub 46. Optical alignment along the optical axis connecting the optical fiber to the laser diode is performed by sliding the alignment member 43 on the outer surface of the cap of the laser module. While, sliding the sleeve can perform the optical alignment in directions intersecting the optical axis 44 and the sleeve cover 45 with the stub 46 on the top surface of the alignment member 43. Thus, all directions of the optical alignment between the laser module M1 and the optical fiber can be performed.

The receptacle 42 of the present embodiment and the optical plug P may not only secure the optical coupling between the laser module M1 and the optical fiber F but also facilitate the attaching/detaching of the optical plug to/from the laser module.

(Sixth Embodiment)

Figure 10:
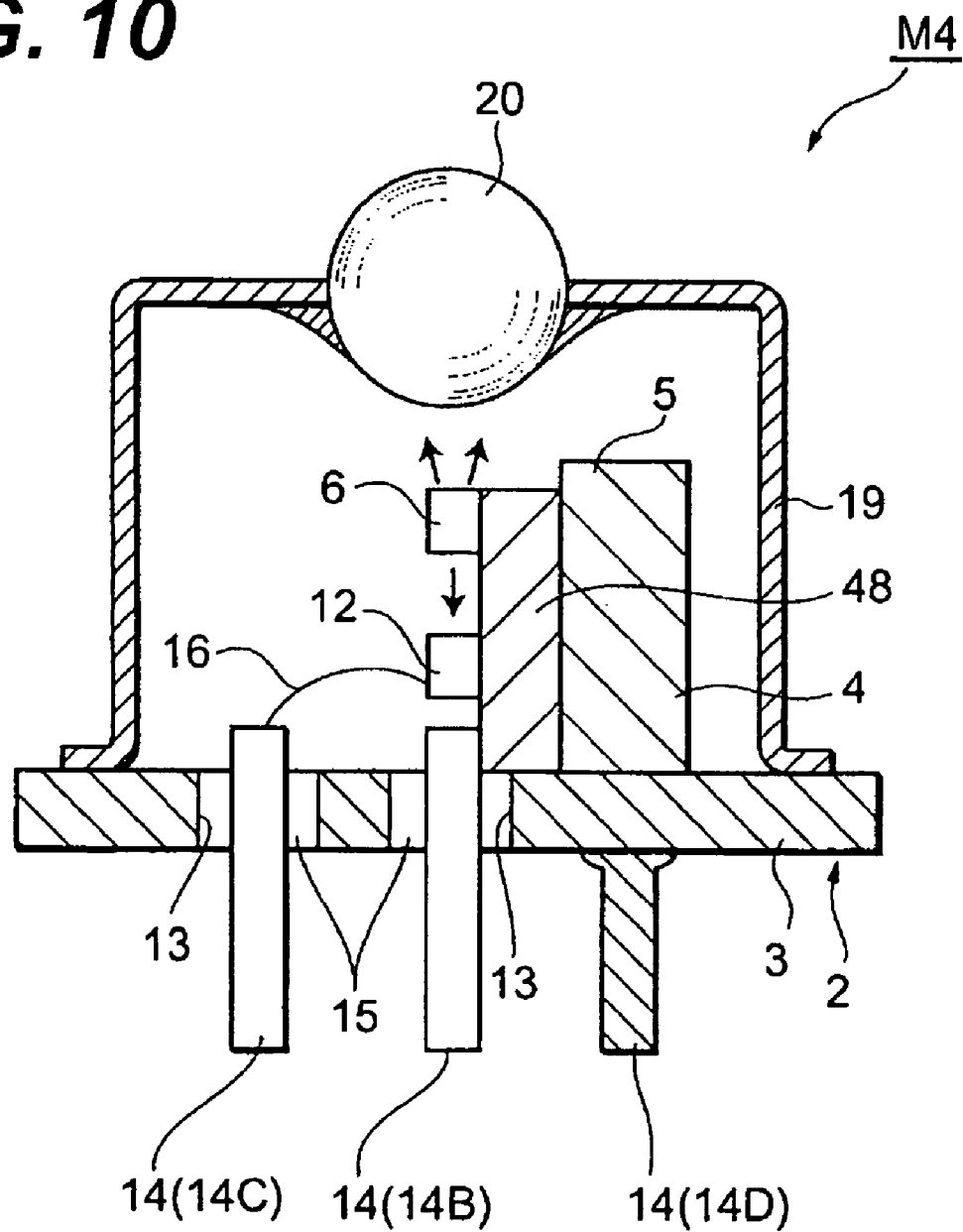
FIG. 10 is a cross section of the semiconductor laser module of the sixth embodiment viewed from the front.

FIG. 10 is a cross sectional view of the six embodiment of the present invention. The laser module M4 of the sixth embodiment has a sub-mount 48 for the laser diode different to that of the first laser module M1. The sub-mount 48 of the present embodiment is attached to the side of the block 4 and extends to the surface of the base 3. The laser diode 6 is mounted on the upper end of the sub-mount 48, while the photo diode is mounted on the lower side thereof The photo diode of the present embodiment has an edge-receiving configuration. Other arrangements, including two transmission lines being provided in both sides of the laser diode 6 on the sub-mount 48, are similar to those shown in the first laser module M1.

In the present embodiment shown in FIG. 10, since the sub-mount 48 extends to the surface of the base 3, the length of a portion protruding from the base 3 of the lead pins 14A and 14B may be further shortened, which further enhances the high frequency performance.

(Seventh Embodiment)

Figure 11:
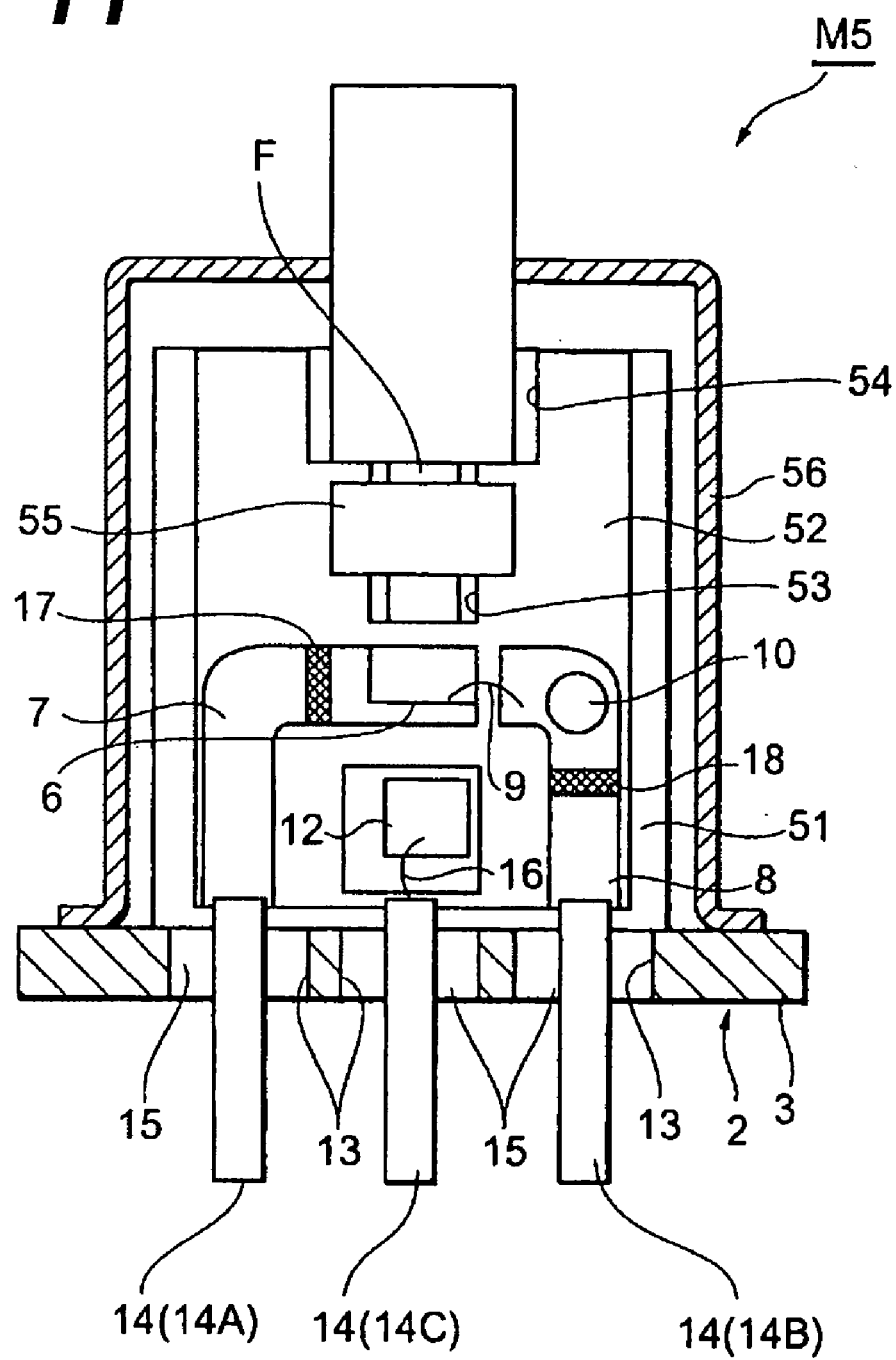
FIG. 11 is a cross section of the semiconductor laser module of the seventh embodiment viewed from the side.
Figure 12:
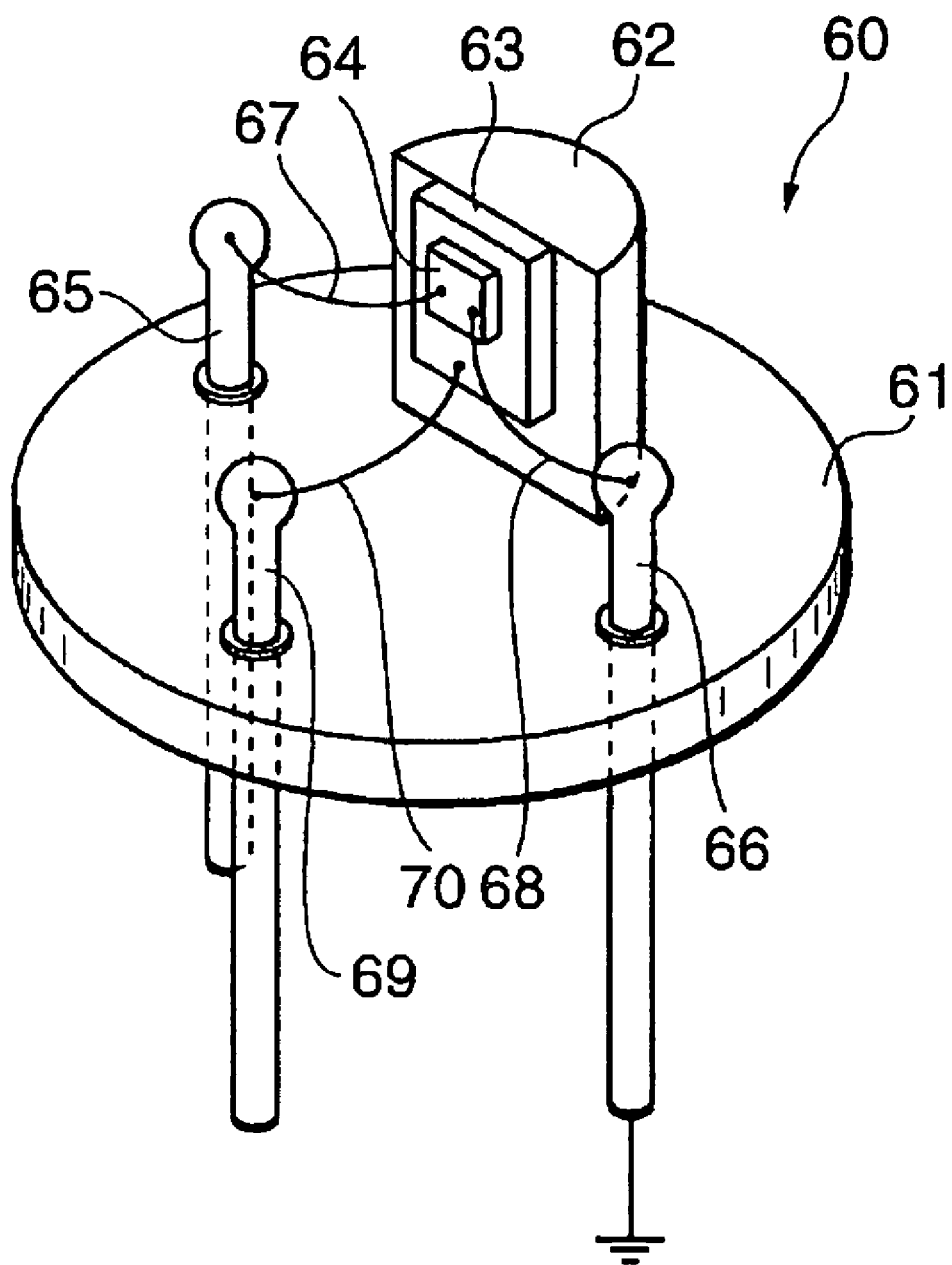
FIG. 12 is a perspective view showing a conventional semiconductor laser module.

FIG. 11 is a side cross sectional view showing a laser module M5 according to the seventh embodiment of the present invention. The laser module M5 has different block and sub-mount for the laser diode 6 as comparing with previously described laser modules. The block 51 of the present embodiment has tall type as shown in the third embodiment shown in FIG. 5 and the sub-mount 52 disposed on the side of the block 51 extends to the surface of the base 3. On the surface of the sub-mount 52 is provided by two transmission lines 7 and 8, and two resistors 17 and 18, and the via holes in the second transmission line 18.

Further, the upper portion of the sub-mount 52 has a V-groove 53 similar to that shown and described in the third embodiment. The V-groove 53 is adjusted in depth to optically align the optical fiber installed therein to the laser diode. The another V-groove 54 having greater width and depth compared to the first V-groove 53 is formed in the extension of the first V-groove 53. A tube for securing the optical fiber is disposed within the second V-groove 54. The cramp for securing the optical fiber within in the first groove 53 is disposed on the first groove 53. These arrangement of two grooves and their additional component are similar to those described for the third embodiment.

The photo diode 12 having the edge-receiving configuration is mounted on the sub-mount beneath the laser diode 6. Other configurations except for the arrangement of the sub-mount and the configuration of the photo diode 12 are similar to those shown in the second embodiment.

Since the laser module M5, similar to the third embodiment, has the V-groove 23 for securing the optical fiber F, the optical coupling thereof with the laser diode 6 may be facilitated, and since disposing the optical fiber into the V-groove 53 can align the optical fiber to the laser diode 6, the lens to couple therebetween can be omitted.

Further, the edge of the sub-mount 52 extends to the surface of the base 3, the length of the portion protruding from the base 3 of the lead pins 14A and 14B can be shortened, which enhances the high frequency performance of the laser module.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A semiconductor laser module for emitting light, said laser module having a co-axial type package, comprising:
   a semiconductor laser diode having one electrode and another electrode for emitting said light by supplying a driving signal between said one electrode and said other electrode;
   a sub-mount for mounting said laser thereon, said sub-mount providing a first transmission line connected to said one electrode of said semiconductor laser diode and a second transmission line connected to said other electrode of said semiconductor laser diode;
   a stem including a disk-shaped base and a block disposed on said base, said block mounting said sub-mount thereon; and
   a first lead pin and a second lead pin provided in said base for inputting an first signal and a second signal, respectively, said driving signal being one of said first signal and said second signal,
   wherein said first lead pin and said second lead pin are directly connected to said first transmission line and said second transmission line, respectively.

2. The semiconductor laser module according to claim 1, wherein said first transmission line extends from one side in a lower to a center portion of said sub-mount, and said second transmission line extends from the other side in a lower to a center portion of said sub-mount, and
   wherein said semiconductor laser diode is mounted on said center portion of said first transmission line, said first lead pin being directly connected to said first transmission line in said one side of said lower portion of said sub-mount and said second lead pin being directly connected to said second transmission line in said other side of said lower portion of said sub-mount.

3. The semiconductor laser module according to claim 2, further includes a photo diode having a surface-receiving configuration for monitoring said light emitted from said semiconductor laser diode, said photo diode being mounted on said base under said center portion of said sub-mount and between said first and second lead pins,
   wherein said photo diode is surrounded by said sub-mount, and said first and second lead pins.

4. The semiconductor laser module according to claim 2, further includes a photo diode having an edge-receiving configuration for monitoring said light emitted from said semiconductor laser diode, said photo diode being mounted on said sub-mount and beneath said semiconductor laser diode,
   wherein said photo diode is surrounded by said semiconductor laser diode, and said first and second transmission lines.

5. The semiconductor laser module according to claim 1, wherein said first and second transmission lines are microstrip lines having predetermined transmission impedance.

6. The semiconductor laser module according to claim 1, wherein at least one of said first and second transmission lines includes a resistor on a way to said semiconductor laser diode.

7. The semiconductor laser module according to claim 6, wherein said resistor is a metal thin film resistor.

8. The semiconductor laser module according to claim 6, wherein said resistor is a chip resistor.

9. The semiconductor laser module according to claim 1, further provides a third lead pin connected to a ground line outside of said laser module, and said second transmission line provides a via hole for electrically connecting said transmission line to said block, wherein said other electrode of said semiconductor laser diode is grounded through said second transmission line, said via hole and said block.

10. The semiconductor laser module according to claim 1, further includes a cap provided on said base for enclosing said semiconductor laser, said sub-mount therein, said base and said cap forming a co-axial TO-CAN type package.

11. The semiconductor laser module according to claim 10, wherein said cap includes a lens for concentrating said light emitted from said semiconductor laser diode.

12. The semiconductor laser module according to claim 1, wherein said sub-mount includes a groove for securing an optical fiber optically coupled to said semiconductor laser diode.

13. A semiconductor laser apparatus, comprising:
   a semiconductor laser module including, a semiconductor laser diode having one electrode and the other electrode for emitting light by supplying a driving signal between said one electrode and said other electrode,
      a sub-mount for mounting said laser thereon, said sub-mount providing a first transmission line connected to said one electrode of said semiconductor laser diode and a second transmission line connected to said other electrode of said semiconductor laser diode,
   a co-axial type package including a tubular cap, a disk-shaped base and a block disposed on said base, said block mounting said sub-mount thereon, and
   a first lead pin and a second lead pin provided in said base for inputting an normal phase signal and an opposite phase signal complementary to said normal phase signal, said first lead pin and said second lead pin being directly connected to said first transmission line and said second transmission line, respectively; and
an optical receptacle including,
   an alignment member disposed to cover said package of said semiconductor laser module,
   a sleeve,
   a stub provided in a portion of said sleeve, said stub including a coupling fiber in a center thereof, and
   a sleeve cover for covering said sleeve and said stub.

* * * * *